US008996949B2

United States Patent
(12) United States Patent
Hansen et al.

(10) Patent No.: US 8,996,949 B2
(45) Date of Patent: Mar. 31, 2015

(54) ENCODING SYSTEM AND METHOD FOR A TRANSMITTER IN WIRELESS COMMUNICATIONS

(71) Applicant: Broadcom Corporation, Irvine, CA (US)

(72) Inventors: Christopher J. Hansen, Los Altos, CA (US); Jason Alexander Trachewsky, Menlo Park, CA (US); Rajendra T. Moorti, Mountain View, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/132,115

(22) Filed: Dec. 18, 2013

(65) Prior Publication Data

US 2014/0105202 A1 Apr. 17, 2014

Related U.S. Application Data

(63) Continuation of application No. 11/056,154, filed on Feb. 14, 2005.

(60) Provisional application No. 60/573,781, filed on May 24, 2004, provisional application No. 60/568,914, filed on May 7, 2004, provisional application No. 60/545,854, filed on Feb. 19, 2004, provisional application No. 60/544,605, filed on Feb. 13, 2004.

(51) Int. Cl.

| | |
|---|---|
| ***H03M 13/00*** | (2006.01) |
| ***H03M 13/03*** | (2006.01) |
| ***H04B 7/06*** | (2006.01) |
| ***H03M 13/27*** | (2006.01) |
| ***H04W 84/12*** | (2009.01) |
| *H03M 13/11* | (2006.01) |
| *H03M 13/15* | (2006.01) |
| *H03M 13/29* | (2006.01) |

(52) U.S. Cl.

CPC ......... *H04B 7/0689* (2013.01); *H03M 13/1102* (2013.01); *H03M 13/1515* (2013.01); *H03M 13/27* (2013.01); *H03M 13/2906* (2013.01); *H03M 13/2936* (2013.01); *H03M 13/2966* (2013.01); *H03M 13/6362* (2013.01); *H04W 84/12* (2013.01)

USPC ............................ 714/755; 714/788; 714/790

(58) Field of Classification Search

USPC .......................................... 714/755, 788, 790

See application file for complete search history.

(56) References Cited

U.S. PATENT DOCUMENTS

| | | | | |
|---|---|---|---|---|
| 3,988,677 A * | 10/1976 | Fletcher et al. | ............... | 714/756 |
| 4,713,817 A * | 12/1987 | Wei | ............... | 714/758 |
| 5,117,427 A * | 5/1992 | Miyake et al. | ............... | 714/755 |
| 5,233,629 A * | 8/1993 | Paik et al. | ............... | 375/262 |
| 5,438,590 A * | 8/1995 | Tzukerman et al. | .......... | 375/259 |

(Continued)

*Primary Examiner* — Joseph D Torres

(74) *Attorney, Agent, or Firm* — Garlick & Markison; Jessica W. Smith

(57) ABSTRACT

Method and system encodes a signal according to a code rate that includes a ratio of uncoded bits to coded bits. An outer encoder encodes the signal into code words. An interleaver converts the code words into a byte sequence for wireless transmission. An inner encoder executes a convolutional code to generate an encoded signal. The encoded signal is transmitted over a plurality of subcarriers associated with a wide bandwidth channel having a spectral efficiency associated with the code rate. The outer encoder includes a Reed-Solomon encoder having a rate that increases the code rate of uncoded bits to coded bits.

20 Claims, 5 Drawing Sheets

(56) References Cited

U.S. PATENT DOCUMENTS 5,442,626 A * 8/1995 Wei .............................. 370/207
5,473,601 A * 12/1995 Rosen et al. .................. 370/319
5,512,957 A * 4/1996 Hulyalkar ..................... 348/607
5,625,624 A * 4/1997 Rosen et al. .................. 370/307
5,659,578 A * 8/1997 Alamouti et al. ............. 375/261
5,708,665 A * 1/1998 Luthi et al. .................... 714/704
5,726,978 A * 3/1998 Frodigh et al. ................ 370/252
5,812,603 A * 9/1998 Luthi et al. .................... 375/287
5,828,677 A * 10/1998 Sayeed et al. ................. 714/774
5,838,728 A * 11/1998 Alamouti et al. ............. 375/265
5,864,547 A * 1/1999 Strodtbeck et al. ........... 370/318
5,886,989 A * 3/1999 Evans et al. ................... 370/347
5,983,383 A * 11/1999 Wolf ............................ 714/755
5,996,103 A * 11/1999 Jahanghir ..................... 714/755
6,070,074 A * 5/2000 Perahia et al. ................ 455/430
6,138,261 A * 10/2000 Wilcoxson et al. ........... 714/755
6,151,296 A * 11/2000 Vijayan et al. ................ 370/208
6,151,312 A * 11/2000 Evans et al. ................... 370/338
6,198,748 B1 * 3/2001 Bruckert ....................... 370/432
6,282,168 B1 * 8/2001 Vijayan et al. ................ 370/203
6,282,187 B1 * 8/2001 Evans et al. ................... 370/347
6,407,843 B1 * 6/2002 Rowan et al. ................. 398/202
6,654,921 B1 * 11/2003 Jones et al. .................. 714/746
6,707,856 B1 * 3/2004 Gardner et al. ............... 375/260
6,738,949 B2 * 5/2004 Senda et al. .................. 714/796
6,754,872 B2 * 6/2004 Zhang et al. .................. 714/786
6,768,517 B2 * 7/2004 Limberg et al. ............... 348/614
6,769,093 B1 * 7/2004 Krieger ......................... 714/814
6,901,115 B1 * 5/2005 Terry ............................ 375/299
6,915,472 B1 * 7/2005 Jones, IV et al. ............. 714/746
6,930,989 B1 * 8/2005 Jones, IV et al. ............. 370/335
6,986,092 B2 * 1/2006 Butler et al. .................. 714/752
7,002,900 B2 * 2/2006 Walton et al. ................. 370/208
7,050,511 B2 * 5/2006 Jeong et al. ................... 375/301
7,206,352 B2 * 4/2007 Birru et al. .................... 375/265
7,209,455 B2 * 4/2007 Yee et al. ................... 370/310.1
7,221,720 B2 * 5/2007 Robinson ...................... 375/341
7,230,978 B2 * 6/2007 Bitterlich et al. ............. 375/219
7,423,996 B2 * 9/2008 Son et al. ...................... 370/335
7,450,613 B2 * 11/2008 Choi et al. .................... 370/486
2001/0047503 A1 * 11/2001 Zhang .......................... 714/784

* cited by examiner

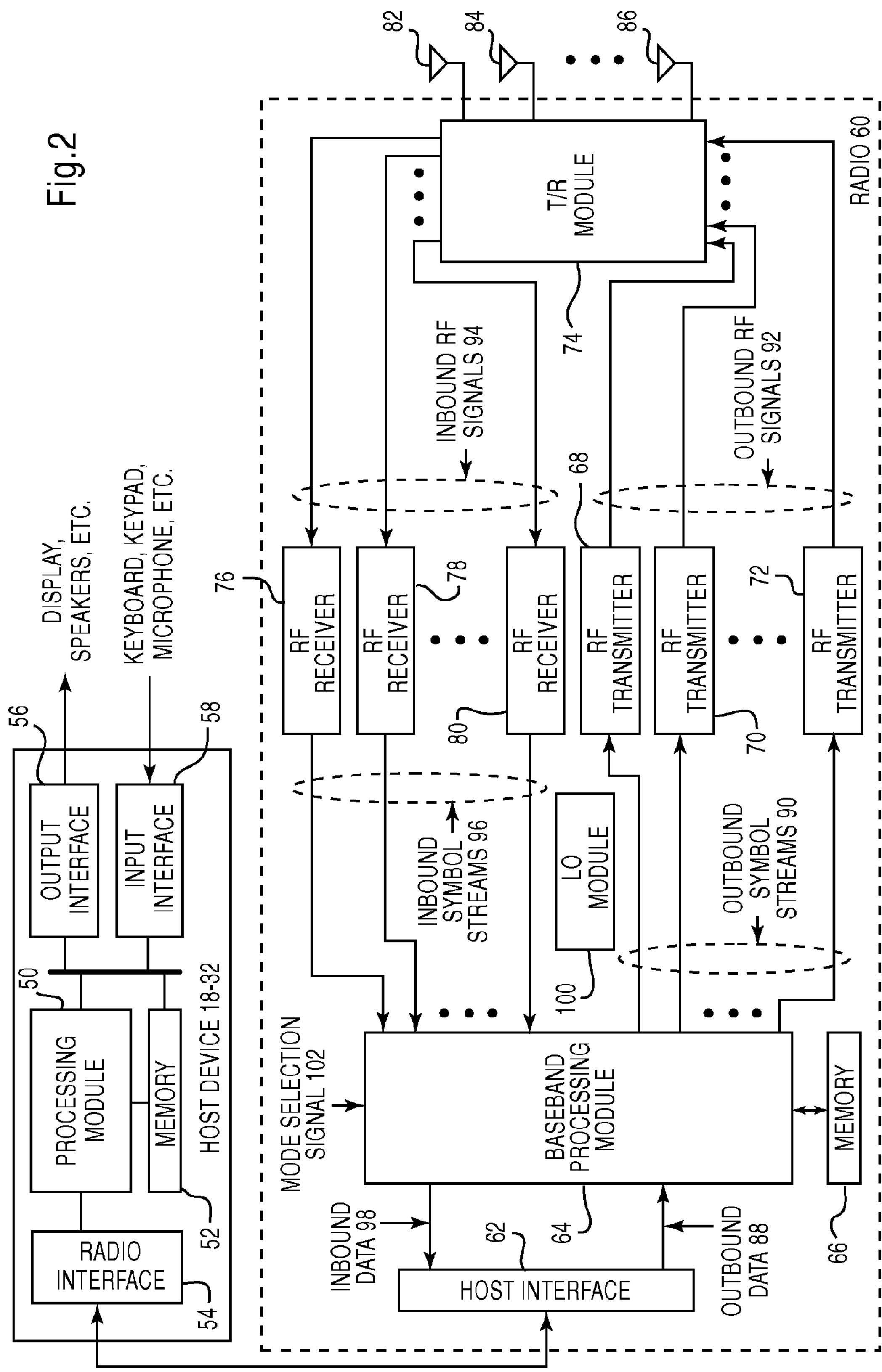
Fig.2
HOST DEVICE 18-32
PROCESSING MODULE
50
MEMORY
52
RADIO INTERFACE
54
OUTPUT INTERFACE
56
INPUT INTERFACE
58
DISPLAY, SPEAKERS, ETC.
KEYBOARD, KEYPAD, MICROPHONE, ETC.
RADIO 60
HOST INTERFACE
62
BASEBAND PROCESSING MODULE
64
MEMORY
66
MODE SELECTION SIGNAL 102
INBOUND DATA 98
OUTBOUND DATA 88
RF RECEIVER
76
RF RECEIVER
78
RF RECEIVER
80
RF TRANSMITTER
68
RF TRANSMITTER
70
RF TRANSMITTER
72
LO MODULE
100
T/R MODULE
74
INBOUND RF SIGNALS 94
OUTBOUND RF SIGNALS 92
INBOUND SYMBOL STREAMS 96
OUTBOUND SYMBOL STREAMS 90
82
84
86

ENCODING SYSTEM AND METHOD FOR A TRANSMITTER IN WIRELESS COMMUNICATIONS

CROSS REFERENCE TO RELATED PATENTS/PATENT APPLICATIONS

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility patent application Ser. No. 11/056,154, entitled "Encoding system and method for a transmitter in wireless communications," filed Feb. 14, 2005, pending, which claims priority pursuant to 35 U.S.C. §119(e) to the following U.S. Provisional patent applications:

a. U.S. Provisional Patent Application Ser. No. 60/544,605, entitled "Multiple protocol wireless communications in a WLAN," filed Feb. 13, 2004.

b U.S. Provisional Patent Application Ser. No. 60/545,854, entitled "WLAN transmitter having high data throughput," filed Feb. 19, 2004.

c. U.S. Provisional Patent Application Ser. No. 60/568,914, entitled "MIMO protocol for wireless communications, ", filed May 7, 2004.

d. U.S. Provisional Patent Application Ser. No. 60/573,781, entitled "Encoder and decoder of a WLAN transmitter having high data throughput,", filed May 24, 2004.

BACKGROUND OF THE INVENTION

1. Field of the Invention

This invention relates generally to wireless communication systems and more particularly to a transmitter transmitting at improved data rates with such wireless communication systems and methods of encoding signals to achieve the data rate.

2. Description of the Related Art

Wireless and wire lined communications may occur between wireless or wire lined communication devices according to various standards or protocols. Communication systems and networks may include national or international cellular telephone systems, the Internet, point-to-point or in-home wireless networks and the like. A communication system is constructed, and may operate in accordance with the standard. For example, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and the like.

Wireless local area networks (WLAN) that may use IEEE 802.11, 802.11a, 802.11b, or 802.11g that employ single input, single output (SISO) wireless communications. Other types of communications include multiple input, single output (MISO), single input, multiple output (SIMO), and multiple input, multiple output (MIMO). With the various types of wireless communications, it may be desirable to use the various types of wireless communications to enhance data throughput within a WLAN.

For example, improved data rates may be achieved with MIMO communications in comparison to SISO communications. Most WLAN, however, include legacy wireless communication devices that are devices compliant with an older version of a wireless communication standard. Thus, a transmitter capable of MIMO wireless communications also may be backward compatible with legacy devices to function in a majority of existing WLANs. One factor for backward compatibility is that transmitters, receivers, and the like assume all signals within a system are valid.

BRIEF SUMMARY OF THE INVENTION

A system for generating a signal for wireless communication is disclosed. The system includes an outer encoder to execute outer encoding having a first rate on a signal to generate at least one code word. The system also includes an interleaver to interleave the at least one code word into a byte sequence. The system also includes an inner encoder to execute convolutional encoding having a second rate on the byte sequence to generate an encoded signal. The first rate and the second rate produce an overall coding rate corresponding with a spectral efficiency.

A method for generating a signal for wireless communication also is disclosed. The method includes executing an outer encoding process on a signal. The outer encoding process has a first rate. The method also includes generating at least one code word from the outer encoding. The method also includes interleaving the at least one code word into a byte sequence. The method also includes convolutionally encoding the byte sequence according to a second rate. The convolutionally encoding includes generating an encoded signal according to an overall coding rate produced by the first rate and the second rate. The overall coding rate corresponds to a spectral efficiency A method for encoding a signal for wireless transmission also is disclosed. The method includes generating a code word from a signal using a Reed-Solomon encoding process. The Reed-Solomon encoding process has a first rate. The method also includes generating an encoded signal from said code word using a convolutional encoding process having a second rate. The first rate and the second rate produce an overall coding rate having a spectral efficiency applicable for a wide bandwidth transmission.

BRIEF DESCRIPTION OF THE SEVERAL VIEWS OF THE DRAWINGS

For proper understanding of the present invention, reference should be made to the accompanying drawings:

FIG. 2 illustrates a wireless communication device in accordance with the present invention;

DETAILED DESCRIPTION OF THE INVENTION

Reference will now be made to the following detailed description of the preferred embodiments of the present invention. Examples of preferred embodiments may be illustrated by the accompanying drawings.

Figure 1:
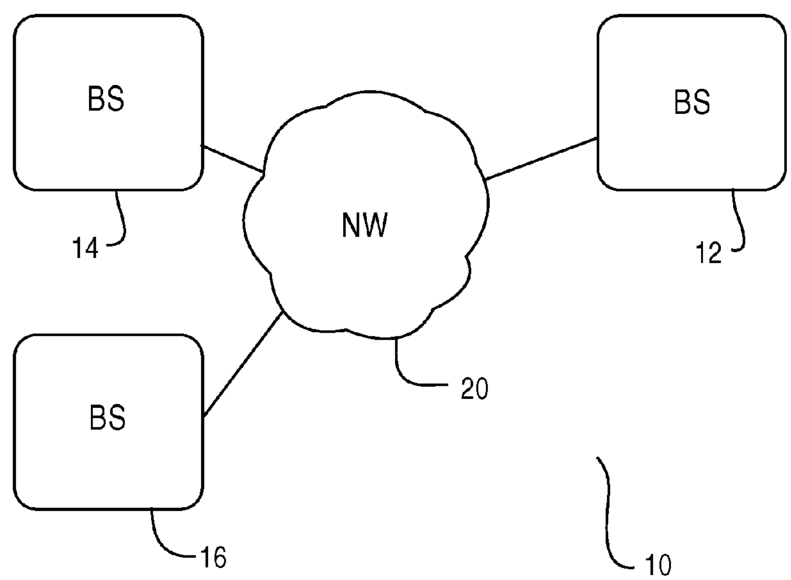
FIG. 1 illustrates a wireless communication system in accordance with the present invention.

FIG. 1 depicts a communication system 10 according to the present invention. Communication system 10 may be a wireless communication system having networks supported by various wireless communication standards or protocols. Communication system 10 includes base stations 12, 14 and 16. Base stations 12, 14 and 16 may provide access for wireless devices and components to communication system 10. Communication system 10 may provide services and content to the devices and components via base stations 12, 14 and 16.

Communication system 10 also may include wide area networks (WANs), local area networks (LANs), wireless local area networks (WLANs), ad-hoc networks, virtual networks, and the like to facilitate the exchange of information or data. For example, network 20 may be coupled to base stations 12, 14 and 16 and support communications with communication system 10.

Communication system 10 may forward data or information in the form of signals, either analog or digital. Wireless devices within the individual base stations may register with the base stations and receive services or communications within communication system 10. The wireless devices may exchange data or information via an allocated channel. Network 20 may set up LANs to support the channel. To support the wireless communication, communication system 10 and its applicable networks may use a standard of protocol for wireless communications. For example, the IEEE 802.11 specification may be used. The IEEE 802.11 specification has evolved from IEEE 802.11 to IEEE 802.11b to IEEE 802.11a and to IEEE 802.11g. Wireless communication devices that are compliant with IEEE 802.11b (standard 11b) may exist in the same wireless local area network as IEEE 802.11g (standard 11g) compliant wireless communication devices. Further, IEEE 802.11a (standard 11a) compliant wireless communication devices may reside in the WLAN as standard 11g compliant wireless communication devices.

These different standards may operate within different frequency ranges, such as 5 to 6 gigahertz (GHz) or 2.4 GHz. For example, standard 11a may operate within the higher frequency range. One feature of standard 11a is that portions of the spectrum from between 5 to 6 GHz may be allocated to a channel. The channel may be 20 megahertz (MHz) wide within the frequency band. Standard 11a also may use orthogonal frequency division multiplexing (OFDM). OFDM may be implemented over sub-carriers that represent lines, or values, within the frequency domain of the 20 MHz channels. A wireless signal may be transmitted over many different sub-carriers within the channel. The sub-carriers are orthogonal to each other so that information may be extracted off each sub-carrier about the signal without appreciable interference.

Legacy devices may exist within communication system 10. Legacy devices are those devices compliant with earlier versions of the wireless standard, but reside in the same WLAN as devices compliant with a current or later version of the standard. A mechanism may be employed to ensure that legacy devices know when the newer version devices are utilized in a wireless channel to avoid interference or collisions.

Thus, newer devices or components within communication system 10 may use current standards that have backward compatibility with already installed equipment. The devices and components may be adaptable to legacy standards and current standards when transmitting information within communication system 10. Legacy devices or components may be kept off the air or off the network so as to not interfere or collide with information or data that they are not familiar with. For example, if a legacy device receives a signal or information supported by standard 11n, then the device should forward the information or signal to the appropriate destination without modifying or terminating the signal or its data. Further, a received signal may not react to the legacy device as if the legacy device is a device compatible with a new or current standard.

Communication system 10 may operate according to the IEEE 802.11n (standard 11n) protocol for wireless communications. Alternatively, communication system 10 may operate under a variety of standards or protocols, such as standard 11a, standard 11g and standard 11n and may include legacy devices or components. For example, certain components may comply with standard 11a while newer components may comply with standard 11n. Standard 11n may occupy the 5 to 6 GHz band, or, alternatively, standard 11n may occupy the 2.4 GHz band. Standard 11n may be considered an extension of standard 11a. Standard 11n devices and components may operate with a data rate that exceeds 100 Mbps. The devices and components within communication system 10 may know the physical layer rate for standard 11n devices and components may be greater than those of previous standards.

Bandwidth for wireless channels under standard 11n may be 20 MHz or 40 MHz. Thus, standard 11n may implement wider bands than previous standards, such as standard 11a. For example, standard 11n may put two 20 MHz bands together as a 40 MHz band and may send twice as much data as previous standards. Moreover, information or data may be filled in a gap between the two 20 MHz bands. The gap results due to falloff between the two bands. By filling in the gap, data or information may be sent according to standard 11n at a rate twice as much as previous standards, if not more.

Communication system 10 also may include a multiple input, multiple output (MIMO) structure. MIMO structures may be implemented in communication system 10 to improve the robustness of wireless communications. To better improve robustness, communication system 10 also may set the number of data streams to be less than the number of transmitters of a wireless device.

Communication system 10 may resolve the issue of signals generated by legacy devices or components and having the signals operate within a MIMO system using multiple antennas. For example, communication system 10 may determine how the standard 11a signals will work within the wider bandwidth of the channels for standard 11n. Communication system 10 may increase the probability of reception of signals transmitting large amounts of data under current standards or protocols. Further, it may be presumed that all the devices and components within communication system 10 may receive all transmitted signals, no matter what format, protocol or standard is used.

FIG. 2 depicts a wireless communication device 200 according to the present invention. Wireless device 200 includes host device 18 and an associated radio 60. For cellular telephone hosts, radio 60 may be a built-in component. For personal digital assistants hosts, laptop hosts, personal computer hosts and the like, radio 60 may be built-in or an externally coupled component.

Host device 18 may include processing module 50, memory 52, radio interface 54, input interface 58 and output interface 56. Processing module 50 and memory 52 may execute instructions that are done by host device 18. For example, for a cellular telephone host device, processing module 50 may perform the corresponding communication functions in accordance with a particular cellular telephone standard, such as standard 11n.

Radio interface 54 may allow data to be received from and sent to radio 60. For data received from radio 60, such as inbound data, radio interface 54 provides the data to processing module 50 for further processing or routing to the output interface 56. Output interface 56 may provide connectivity to an output display device such as a display, monitor, speakers and the like, such that the received data may be displayed. Radio interface 54 also may provide data from the processing module 50 to radio 60. Processing module 50 may receive the outbound data from an input device such as a keyboard, keypad, microphone an the like, via input interface 58 or may generate the data itself. For data received via input interface 58, processing module 50 may perform a corresponding host function on the data or route it to radio 60 via the radio interface 54.

Radio 60 may include a host interface 62, a baseband processing module 64, memory 66, a plurality of radio frequency (RF) transmitters 68-72, a transmit/receive (T/R) module 74, a plurality of antennas 82-86, a plurality of RF receivers 76-80, and a local oscillation module 100. Baseband processing module 64, in combination with operational instructions stored in memory 66, may execute digital receiver functions and digital transmitter functions, respectively. Baseband processing modules 64 may be implemented using one or more processing devices. Memory 66 may be a single memory device or a plurality of memory devices. When processing module 64 implements one or more of its functions via a state machine, analog circuitry, digital circuitry, or logic circuitry, memory 66 storing the corresponding operational instructions is embedded with the circuitry comprising the state machine, analog circuitry, digital circuitry, or logic circuitry.

Radio 60 may receive outbound data 88 from host device 18 via host interface 62. Baseband processing module 64 receives outbound data 88 and, based on a mode selection signal 102, produces one or more outbound symbol streams 90. Mode selection signal 102 may indicate a particular mode.

Baseband processing module 64, based on mode selection signal 102, may produce one or more outbound symbol streams 90 from output data 88. For example, if mode selection signal 102 indicates that a single transmit antenna is being utilized for the particular mode that has been selected, baseband processing module 64 may produce a single outbound symbol stream 90. Alternatively, if mode selection signal 102 indicates 2, 3 or 4 antennas, baseband processing module 64 may produce 2, 3 or 4 outbound symbol streams 90 corresponding to the number of antennas from output data 88.

Depending on the number of outbound streams 90 produced by baseband module 64, a corresponding number of the RF transmitters 68-72 may be enabled to convert outbound symbol streams 90 into outbound RF signals 92. Transmit/receive (T/R) module 74 may receive outbound RF signals 92 and provides each outbound RF signal to a corresponding antenna 82-86.

When radio 60 is in a receive mode, T/R module 74 may receive one or more inbound RF signals via antennas 82-86. T/R module 74 provides inbound RF signals 94 to one or more RF receivers 76-80. RF receivers 76-80 may convert inbound RF signals 94 into a corresponding number of inbound symbol streams 96. The number of inbound symbol streams 96 may correspond to the particular mode in which the data was received. Baseband processing module 60 may receive inbound symbol streams 90 and converts them into inbound data 98, which are provided to the host device 18 via the host interface 62.

Figure 3:
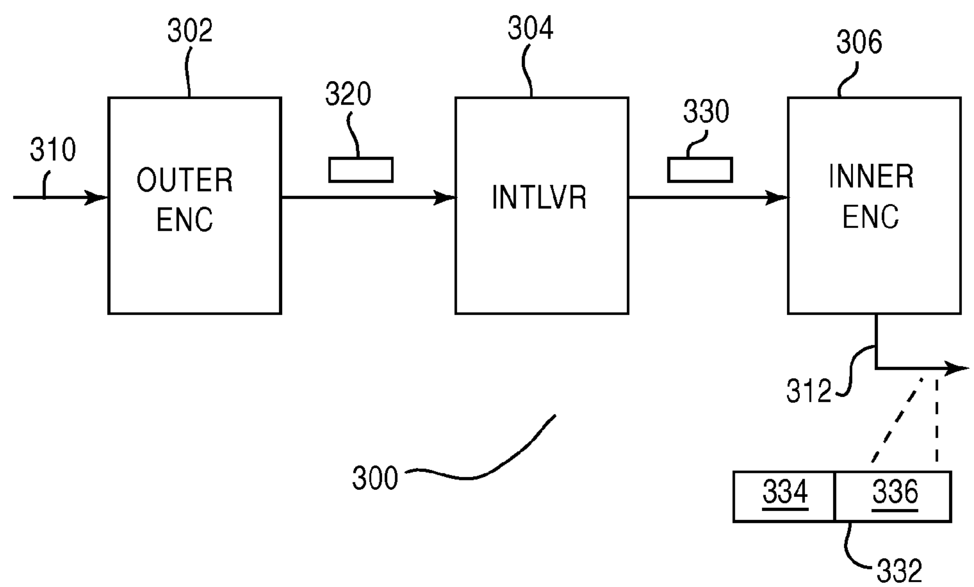
FIG. 3 illustrates an encoding system in accordance with the present invention.

FIG. 3 depicts an encoding system 300 for use with wireless communications according to the present invention. Encoding system 300 may be coupled to a transceiver to code signals for transmission within a wireless network or system. Alternatively, encoding system 300 may be coupled to other devices or components for wireless communications. Further, encoding system 300 may be within the transceiver. Encoding system 300 also may operate or encode according to an applicable wireless communication standard or protocol. For example, encoding system 300 may operate according to standard 11n, so that encoded signals are formatted to take advantage of the improvements of standard 11n over legacy standards.

Encoding system 300 may include outer encoder 302, interleaver 304 and inner encoder 306. Encoding system 300 receives data or information as signal 310 at outer encoder 302. Inner encoder 306 outputs coded signal 312. A code rate may be determined by comparing signal 310 with coded signal 312. The code rate also may be referred to as an overall coding rate. For example, a code rate may be the ratio of uncoded bits in signal 310 to the coded bits in coded signal 312. For example, the code rate may be the ratio of the data rate to the coded data rate, or data rate/coded data rate. Encoding system 300 may improve the code rate over legacy systems so as to comply with standard 11n.

The overall code rate may correspond to a specified spectral efficiency. The specified spectral efficiency may be known as a high spectral efficiency. The spectral efficiency may be the ratio of the data rate to the signal bandwidth. For example, a code rate may be 0.8 or higher to support a high spectral efficiency corresponding with the larger signal bandwidth of standard 11n. Further according to the example, coding system 300 may include a code rate of 0.8 at 100 megabits/second for a channel having a 40 MHz bandwidth. Constraints applied by standard 11n may warrant a high code rate to increase the ratio of uncoded bits to coded bits over legacy standards. Thus, outer encoder 302, interleaver 304 and inner encoder 306 may operate according to the constraints and a target code rate of 0.8.

Encoding system 300 may code bits to improve performance over a system of uncoded bits. A tradeoff, however, may exist between performance and complexity of encoding system 300. Thus, if encoding system 300 becomes too complex, any benefit from improved performance may be offset by higher costs in constructing and implementing encoding system 300.

Outer encoder 302 may include a Reed-Solomon (R-S) encoder. An R-S encoder may be applicable for coding longer frames. When encoding, encoding system 300 may forward longer frames with an increased probability of being received correctly. Outer encoder 302 may implement the R-S encoder even if the applicable wireless standard uses short frames. Further, outer encoder 302 may be separable from any convolutional coding, such as that done by inner encoder 306. Outer encoder 302 may receive data or information as bits or bytes and then codes the bits or bytes for interleaver 304. For example, outer encoder 302 may generate 2-5 code words comprised of bytes. In the example, a code word 320 may include about 255 bytes with about 239 information bytes. Thus, codeword 320 also may include about 16 redundant bytes.

Interleaver 304 receives code word 320 to perform interleaving on the bytes in code word 320, and to generate bits or bytes 330. Interleaver 304 may be a byte interleaver to interleave one sequence of bytes into a new sequence of bytes before entering outer encoder 306. Interleaver 304 may reduce an error rate of encoding system 300 by resolving errors before the errors arrive at inner encoder 306. Bit or byte errors from outer encoder 302 may be randomly generated, but also may occur in bursts. Interleaver 304 may operate according to a specified rate or operator.

Inner encoder 306 receives bits or bytes 330 and performs convolutional coding to generate coded signal 312. Inner encoder 306 may be a convolutional encoder that in conjunction with outer encoder 302 establishes the desired code rate. For example, inner encoder 306 and outer encoder 302 may work together to develop a code rate of about 0.8. Inner encoder 306 and outer encoder 302, however, may be separable from each other. Thus, outer encoder 302 and its encoding schemes may be removed or changed within encoding system 300 without impacting inner encoder 306, or its convolutional code. Thus, modularity between the encoding schemes may exist to improve performance without increased complexity to existing systems, or the need of new code or devices for encoding system 300.

Further, the convolutional code of inner encoder 306 may be punctured at ⅞s on a binary convolutional code. The coding rate of inner encoder 306 may generate a code rate of 0.8 for encoding system 300, when combined with the code rate of outer encoder 302. Referring back to the R-S encoder, examples of the R-S code may have a rate that is multiplied by the code rate of a ⅞s convolutional code to achieve a code rate 0.8. Further, inner encoder 306 may be a convolutional encoder operable with legacy standards, such as standard 11a.

Coded signal 312 may include frame 332. Frame 332 may be one of many frames within coded signal 332. Frame 332 includes preamble, or header, field 334 and data field 336. Preamble field 334 may be referred to as a preamble. Preamble field 334 may include data or information regarding frame 332 or coded signal 312. The information may include, but is not limited to, length of frame 332. Alternatively, preamble field 334 may include information regarding code words from outer encoder 302 or information about coded signal 312. Preamble field 334, however, is not so large as to make frame 332 unreadable or unusable. Preamble field 334 also may include short and long training fields.

With regard to inner encoder 306, it may be the same convolutional encoder as used in conjunction with standard 11a. Puncturing of the convolutional code according to standard 11a may also be ⅔ and ¾. Options may be added for these codes, such as a 256 state code or new puncturings for rates of ⅘, ⅚ and ⅞, as discussed above. Thus, inner encoder 306 may be an encoder having the above puncture rates. Moreover, the options listed above may be combined, if desired.

Interleaver 304 may be in different states for operation within encoding system 300. One state may be an "off" state, wherein encoding system 300 acts as if no interleaver 304 is present. Another state may be as an interleaver having sufficient depth to randomize the demodulated bits over R-S code words, such as code word 320.

Outer encoder 302 may operate or generate code words having multiple lengths. As noted above, code word 320 may have a length of about 255, or n, with an information sequence length of about 239 bits, or k. Thus, a correction of up to 8 byte errors may be allowed per code word from outer encoder 302.

For an effective code rate of about 0.8, encoding system 300 may execute a coding process having a high spectral efficiency that achieves a gain of about 4 dB, or above, over the convolutional coding scheme alone. Further, additional components may be included in encoding system 300 that facilitate the coding process. Moreover, the coding processes of outer encoder 302 and inner encoder 306 may differ from each other.

Figure 4:
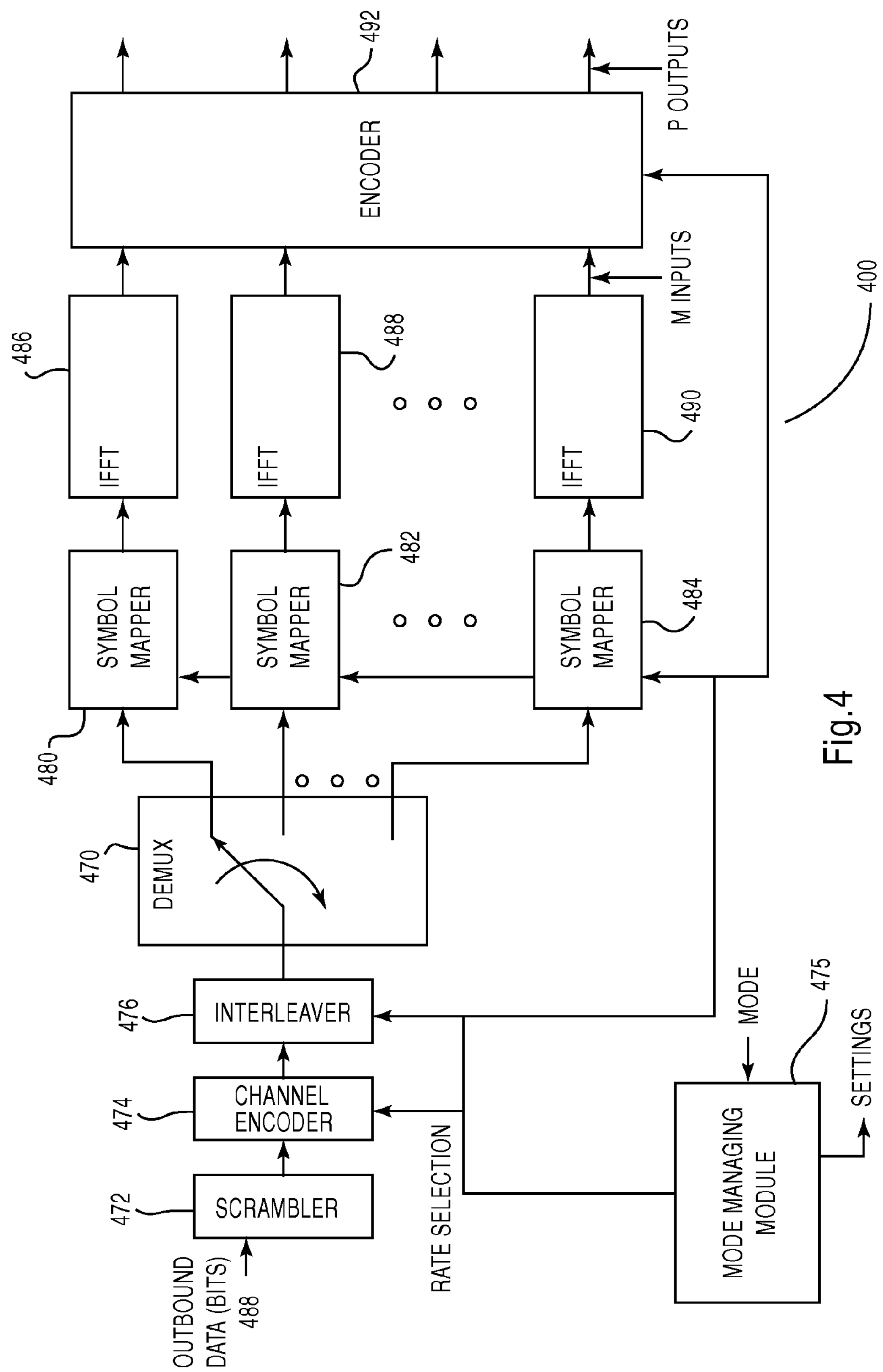
FIG. 4 illustrates a transmitter in accordance with the present invention.

FIG. 4 depicts a block diagram of a transmitter 400 according to the present invention. Transmitter 400 includes scrambler 472, channel encoder 474, interleaver 476, demultiplexer 470, a plurality of symbol mappers 480, 482 and 484, a plurality of inverse fast Fourier transform (IFFT) modules 486, 488 and 490 and encoder 492. Transmitter 400 also may include a mode manager module 475 that receives a mode selection signal and produces settings for transmitter 400.

Scrambler 472 may add a pseudo-random sequence to outbound data bits 488 so that the applicable data or information may appear random. A pseudo-random sequence may be generated from a feedback shift register having a generator polynomial to produce scrambled data. Channel encoder 474 may receive the scrambled data and generate a new sequence of bits having redundancy. The new sequence may enable improved detection at a receiver. Channel encoder 474 may operate in one of a plurality of modes. These modes may correspond to standards or protocols for wireless communications. For example, modes may be assigned to standard 11a, standard 11g, or standard 11n. Backward compatibility with standard 11a and standard 11g may be achieved. Further, channel encoder 474 may be a convolutional encoder with 64 states and a rate of ½. The output of channel encoder 474, as a convolutional encoder, may be punctured at rates of ½, ⅔ and ¾. For backward compatibility with standard 11b and the CCK modes of standard 11g, channel encoder 474 may have the form of a CCK code as defined in standard 11b.

For improved data rates, such as those desired by standard 11n, channel encoder 474 may use the convolutional encoding, as described above. Alternatively, channel encoder 474 may use a more powerful code, including a convolutional code with more states, a parallel concatenated, or turbo, code or a low-density parity check block code. In addition, any one of these codes may be combined with an R-S code of an outer encoder. As discussed above, the outer encoder may be a Reed-Solomon encoder. The choice of applicable code may be determined according to backward compatibility and low-latency requirements.

Interleaver 476 may receive the encoded data and distribute the data over multiple symbols. This distribution may allow improved detection and error correction capabilities at a receiver. Interleaver 476 may follow standard 11a or standard 11g in backward compatible modes. For increased performance modes, such as those associated with standard 11n, interleaver 476 may interleave data over multiple transmit streams. Thus, these modes may be applicable to MIMO configurations. Demultiplexer 470 may convert the interleave stream from interleaver 476 into parallel streams for transmission.

Symbol mappers 480, 482, and 484 may receive a corresponding one of the parallel paths of data from demultiplexer 470. Transmitter 400 may include any number of symbol mappers and is not limited to the aspects shown by FIG. 4. Further, the number of parallel data streams may vary according to the requirements of transmitter 400. For example, the number of data streams may correspond to a number of antennas used for transmitting. Further, the number of symbol mappers may correspond to the number of antennas.

Symbol mappers 480, 482 and 484 may map the bit streams, or data streams, to quadrature amplitude modulated (QAM) symbols. The map symbols generated by symbol mappers 480, 482 and 484 may be provided to IFFT modules 486, 488 and 490. IFFT modules 486, 488 and 490 may be referred to as cyclic prefix addition modules. The number of IFFT modules may correspond to the number of symbol mappers and data streams. IFFT modules 486, 488 and 490 may perform frequency domain to time domain conversions and may add a prefix that allows removal of inter-symbol interference at a receiver. The length of the IFFT and any applicable cyclic prefix may be defined. For example, a 64 point IFFT may be used for 20 MHz channels and 128 point IFFT may be used for 40 MHz channels, used according to standard 11n.

Encoder 492 may receive the parallel paths of the time domain symbols and convert them into output symbols. Encoder 492 also may be referred to as a space/time encoder. The number of input paths to encoder 492 may equal the number of output paths. Alternatively, the number of output paths may equal the number of input paths plus 1. For each of the paths, encoder 492 multiplies the input symbols with an encoding matrix having a form shown in Equation 01 below.

$$\begin{bmatrix} C_1 & C_2 & C_3 & \dots & C_{2M-1} \\ -C_2^* & C_1^* & C_4 & \dots & C_{2M} \end{bmatrix} \tag{01}$$

The rows of the encoding matrix may correspond to the number of input paths and the columns may correspond to the number of output paths. Thus, outbound data bits 488 may be encoded and prepared for transmission by transmitter 400, and converted to multiple output streams. Thus, transmitter 400 may support multiple output structures and operations.

Figure 5:
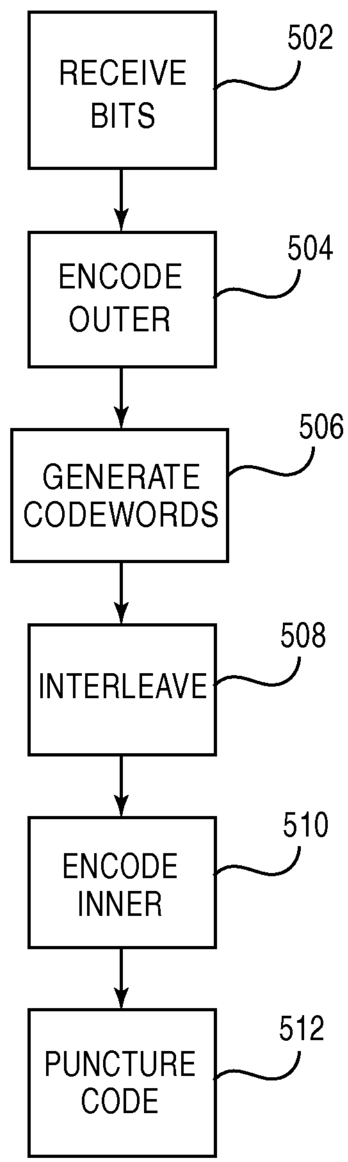
FIG. 5 illustrates a flowchart for encoding data in accordance with the present invention.

FIG. 5 depicts a flowchart for encoding data for wireless communications according to the present invention. The steps shown in FIG. 5 may be used for converting outbound data into one or more outbound data streams for multiple output transmission. Step 502 executes by receiving data bits for transmission. The bits may be generated or created for transmission in a wireless network or system according to a standard or protocol. For example, standard 11n may be applicable to the system or network that exchanges the data bits. Alternatively, the applicable system or network may have standard 11a and standard 11n devices or components. Thus, the received bits may be received by legacy devices.

Step 504 executes by encoding the bits according to an outer encoder, such as outer encoder 302 in FIG. 3. The outer encoder may encode the bits or bytes according to the specified encoding process, such as Reed-Solomon encoding. For example, the outer encoder may be an R-S encoder. The R-S encoder may be effective in coding longer frames. Step 504 performs the outer encoding of the received bits. Step 506 executes by generating code words from the outer encoder. The code words may be bytes. As discussed above, the code words may include about 255 bytes.

Step 508 executes by interleaving the code words from bytes into bytes or bits. Thus, the received code words from the outer encoder may be interleaved into bits or bytes for use with multiple data streams. Alternatively, codeword bytes may be interleaved from one sequence of bytes into a new sequence of bytes. An interleaver, such as interleaver 304, may be implemented. Moreover, step 508 may be skipped if no outer encoding is performed on the received bits. For example, the received bytes may be meant for a network or system having only legacy devices, such as those compatible with standard 11a. The received bytes, in this example, may not undergo outer encoding to improve performance and to increase throughput. Thus, step 508 may be skipped.

Step 510 executes by encoding the interleaved bytes according to an inner encoder, such as inner encoder 306. For example, the inner encoder may be a convolutional encoder. The convolutional encoder may encode the bits using convolutional coding techniques. The convolutional encoder may encode the bits to produce a sequence of coded output. The convolutional encoder may process multiple symbols at a time. The inner encoder also may be specified such that if the encoder receives a number of input streams, then an input vector length may be determined. An output vector length also may be determined according to the number of output streams. Thus, the received bits or bytes may be coded according to the convolutional encoder, or the inner encoder. The inner encoder may code to a specified rate, such as ½. Alternatively, the inner encoder may code to other rates, such as ¾, ⅘ and ⅞.

Step 512 executes by puncturing the coded bits or bytes. Step 512 may periodically remove bits or bytes from the encoded bit streams received from the inner encoder. Thus, the code rate may be increased, along with the spectral efficiency corresponding to the wider bandwidth for standard 11n. A puncture pattern may be specified by a puncture vector parameter. A puncture vector may be a binary column vector that indicates a bit in a corresponding position of an input vector is sent to the output vector, or is removed. Thus, bits in various positions may be transmitted while bits and other positions may be removed. For example, for every 7 bits of input, the punctured code generates 8 bits of output. Thus, the puncture rate may be ⅞. The code rate may be determined by the puncture convolutional code rate and the code rate of the outer encoder. As discussed above, a code rate may be equal to about 0.8 or greater.

Thus, various embodiments of an encoder system and applicable methods for use in wireless communication systems is disclosed. As one of average skill in the art will appreciate, other embodiments and variations thereof may be derived from the teaching of the present invention without deviating from the scope of the claims and their equivalents.

What is claimed is:

1. A transmitter, comprising:
- an outer encoder operable to encode outbound data to generate at least one code word in a first mode of operation and wherein the outer encoder is disabled from encoding the outbound data in a second mode of operation;
- an interleaver operable to interleave the at least one code word in the first mode of operation and interleave the outbound data in the second mode of operation;
- an inner encoder operable to use a convolutional code to generate an encoded signal, wherein the inner encoder generates the encoded signal at a first predetermined overall rate in the first mode of operation and at a second predetermined overall rate in the second mode of operation; and
- a transmitter module operable to transmit the plurality of transmit streams over a plurality of antennas.

2. The transmitter of claim 1, wherein the outer encoder is operable to encode the outbound data at a first rate in the first mode of operation and the inner encoder is operable to encode the plurality of signal streams at a second rate using the convolutional code in the first mode of operation, wherein the first rate and the second rate provide the first predetermined overall rate.

3. The transmitter of claim 2, wherein the first predetermined overall rate in the first mode of operation includes at least one rate described in the IEEE 802.11n standard for a 40 MHz bandwidth channel.

4. The transmitter of claim 1, wherein the inner encoder encodes one signal stream using a convolutional code to generate a single transmit stream in the second mode of operation having the second predetermined overall rate in the second mode of operation.

5. The transmitter of claim 4, wherein the first mode of operation complies with a mode of operation described in IEEE 802.11n standard and wherein the second mode of operation complies with a mode of operation described in at least one of: IEEE 802.11a, 802.11b or IEEE 802.11g standards.

6. The transmitter of claim 5, further comprising:
a mode managing module operable to output a mode selection signal that indicates a mode of operation to the outer encoder, the interleaver and the inner encoder.

7. The transmitter of claim 5, wherein the inner encoder is operable to use a convolutional code with 64 states and a rate of ½, ⅔ and ¾ when operating in the second mode of operation.

8. The transmitter of claim 1, wherein the interleaver is operable to interleave the at least one code word for mapping into multiple symbols over a single signal stream in the second mode of operation.

9. The transmitter of claim 8, further comprising:
a demultiplexer to generate a plurality of transmit streams having the first predetermined overall rate in the first mode of operation and to pass the single signal stream having the second predetermined overall rate in the second mode of operation.

10. The transmitter of claim 9, further comprising:
a plurality of symbol mappers, wherein the plurality of signal streams pass through the plurality of symbol mappers in the first mode of operation pass and wherein the one signal stream passes through one of the plurality of symbol mappers in the second mode of operation; and
a plurality of inverse Fourier transform modules, wherein the plurality of inverse Fourier transform modules transform the plurality of transmit streams into time domain symbols in the first mode of operation pass and wherein one of the plurality of inverse Fourier transform modules transforms the single transmit stream into time domain symbols in the second mode of operation.

11. The transmitter of claim 10, wherein the inner encoder encodes the time domain symbols of the plurality of transmit streams using the convolutional code in the first mode of operation, wherein the encoding by the inner encoder includes adding code states and puncturing the convolutional code to generate encoded signals.

12. The transmitter of claim 11, wherein the first mode of operation complies with at least one mode of operation described in IEEE 802.11n standard and wherein the second mode of operation complies with at least one mode of operation described in at least one of: IEEE 802.11a, 802.11b and IEEE 802.11g standards.

13. A method for encoding in a transmitter, comprising:
encoding outbound data by an outer encoder to generate at least one code word in a first mode of operation and disabling the outer encoder from encoding the outbound data in a second mode of operation;
interleaving the at least one code word by an interleaver, wherein the interleaver is operable to interleave the at least one code word for mapping into multiple symbols over a plurality of signal streams in the first mode of operation and to interleave the outbound data into a single signal stream in the second mode of operation;
receiving the plurality of signal streams by an inner encoder and using a convolutional code to generate a plurality of transmit streams in the first mode of operation and using a convolutional code to generate a single transmit stream in the second mode of operation; and
transmitting the plurality of transmit streams over a plurality of antennas in the first mode of operation and transmitting the single transmit stream over a single antenna in the second mode of operation.

14. The method of claim 13, further comprising:
encoding the outbound data by the outer encoder at a first rate in the first mode of operation; and
encoding the plurality of signal streams at a second rate by the inner encoder using the convolutional code in the first mode of operation, wherein the first rate and the second rate provide a first predetermined overall rate.

15. The method of claim 13, further comprising:
receiving a mode selection signal that indicates one of the plurality of modes of operation.

16. A transmitter, comprising:
an outer encoder that encodes outbound data to generate at least one code word when operational in a first mode of operation and wherein the outer encoder is disabled from encoding the outbound data in a second mode of operation;
an interleaver that interleaves the at least one code word when operational in the first mode of operation, wherein the interleaver is operable to interleave the at least one code word for mapping into multiple symbols over a plurality of signal streams in the first mode of operation and to interleave the outbound data into a single signal stream in the second mode of operation;
an inner encoder that receives the plurality of signal streams when operational in the first mode of operation and that uses a convolutional code to generate a plurality of transmit streams when operational in the first mode of operation and using a convolutional code to generate a single transmit stream in the second mode of operation; and
a transmitter module operable to transmit the plurality of transmit streams over a plurality of antennas and to transmit the single transmit stream over a single antenna in the second mode of operation.

17. The transmitter of claim 16, wherein the outer encoder encodes the outbound data at a first rate when operational in the first mode of operation and the inner encoder encodes the plurality of signal streams at a second rate using the convolutional code when operational in the first mode of operation, wherein the first rate and the second rate provide a predetermined overall rate.

18. The transmitter of claim 17, wherein the first predetermined overall rate in the first mode of operation includes at least one rate described in the IEEE 802.11n standard for a 40 MHz bandwidth channel.

19. The transmitter of claim 16, wherein the first mode of operation complies with at least one mode of operation described in IEEE 802.11n standard and wherein the second mode of operation complies with at least one mode of operation described in at least one of: IEEE 802.11a, 802.11b and IEEE 802.11g standards.

20. The transmitter of claim 16, further comprising:
a mode managing module operable to output a mode selection signal that indicates a mode of operation to the outer encoder, the interleaver and the inner encoder.

* * * * *